US007888845B2

(12) United States Patent
Hielscher et al.

(10) Patent No.: US 7,888,845 B2
(45) Date of Patent: Feb. 15, 2011

(54) DEVICE FOR COUPLING LOW-FREQUENCY HIGH-POWER ULTRASOUND RESONATORS BY A TOLERANCE-COMPENSATING FORCE-TRANSMITTING CONNECTION

(75) Inventors: Holger Hielscher, Teltow (DE); Thomas Hielscher, Stahnsdorf (DE); Harald Hielscher, Stahnsdorf (DE)

(73) Assignee: Dr. Hielscher GmbH, Teltow (DE)

( * ) Notice: Subject to any disclaimer, the term of this patent is extended or adjusted under 35 U.S.C. 154(b) by 312 days.

(21) Appl. No.: 12/268,716

(22) Filed: Nov. 11, 2008

(65) Prior Publication Data

US 2009/0121814 A1 May 14, 2009

Related U.S. Application Data

(60) Provisional application No. 60/987,109, filed on Nov. 12, 2007.

(51) Int. Cl.
*H01L 41/08* (2006.01)

(52) U.S. Cl. .................... 310/325; 310/323.19; 310/354

(58) Field of Classification Search ............ 310/323.19, 310/325, 354
See application file for complete search history.

(56) References Cited

U.S. PATENT DOCUMENTS 3,148,293 A * 9/1964 Jones et al. .................. 310/26
3,845,332 A * 10/1974 Last ......................... 310/325
4,193,009 A * 3/1980 Durley, III ............. 310/323.19
4,850,534 A * 7/1989 Takahashi et al. ........ 239/102.2
6,218,768 B1 * 4/2001 Lee et al. .................... 310/325
6,737,787 B2 * 5/2004 Komoda et al. ........ 310/323.04
6,933,656 B2 * 8/2005 Matsushita et al. ..... 310/323.12
7,187,105 B2 * 3/2007 Shiba ......................... 310/325
7,459,831 B2 * 12/2008 Ludwiczak ................. 310/321
7,514,846 B2 * 4/2009 Stegelmann ........... 310/323.19
2007/0063618 A1 * 3/2007 Bromfield ............. 310/323.19
2009/0066192 A1 * 3/2009 Taki et al. ................... 310/354
2009/0079300 A1 * 3/2009 Hielscher et al. ............ 310/324

FOREIGN PATENT DOCUMENTS

JP 05328756 A * 12/1993

* cited by examiner

*Primary Examiner*—J. SanMartin
(74) *Attorney, Agent, or Firm*—Norris McLaughlin & Marcus, PA

(57) ABSTRACT

The invention relates to a device for coupling low-frequency high-power ultrasound resonators by a tolerance-compensating force-transmitting connection having at least one contact surface between the at least two resonators on or proximate to the oscillation maximum of the oscillation to be transmitted by the coupling for the purpose of transmitting low-frequency ultrasound power between the resonators coupled in this manner.

18 Claims, 3 Drawing Sheets

DEVICE FOR COUPLING LOW-FREQUENCY HIGH-POWER ULTRASOUND RESONATORS BY A TOLERANCE-COMPENSATING FORCE-TRANSMITTING CONNECTION

BACKGROUND OF THE INVENTION

The invention relates to a device for coupling low-frequency high-power ultrasound resonators by a tolerance-compensating force-transmitting connection having at least one contact surface between the at least two resonators on or proximate to the oscillation maximum of the oscillation to be transmitted by the coupling for the purpose of transmitting low-frequency ultrasound power between the resonators coupled in this manner.

Low-frequency high-power ultrasound sound (NFLUS) is ultrasound with a operating frequency of 15 to 100 kHz, preferably 15 to 60 kHz, e.g. 30 kHz, and an acoustic power of 5 W, preferably 10 W to 5,000 W, e.g. 100 W. For example, piezoelectric or magnetostrictive systems are used for generating ultrasound. Linear acoustic transducers and flat or curved plate oscillators or tubular oscillators are known. Low-frequency high-power ultrasound has important applications in the treatment of liquids, such as food, cosmetics, paints and nano materials. Also known are applications, such as nebulizing liquids, levitation, welding and cutting. For many of these applications, ultrasound is transmitted from the resonator generating the ultrasound with amplitudes of 1 to 350 μm, preferably 10 to 80 μm, e.g. 35 μm, to the tool which is likewise configured as a resonator and adapted to the application. Lambda is the wavelength resulting from the NFLUS frequency and the speed of sound in the resonator. Each resonator can be composed of one or several Lambda/2 elements. Lambda/2 elements can have different cross-sectional geometries in the material, e.g. circular, oval or rectangular cross sections. The cross-sectional geometry and area can vary along the longitudinal axis of a Lambda/2 element. Lambda/2 elements can be fabricated, inter alia, of metallic or ceramic materials, or glass, in particular of titanium, titanium alloys, steel or steel alloys, aluminum or aluminum alloys, e.g. of titanium grade 5.

For coupling two or more resonators, these resonators are mostly connected with one another by interior or exterior screws for force transmission or with a positive fit. Threaded blind holes, which are screwed together with a threaded bolt, can be disposed on the respective ends of the resonators to be connected. One of the resonators to be connected can also have a threaded stem, which is screwed into a corresponding threaded bore of the other resonator.

With this type of connection, a pressure is produced between the contact faces of the resonators, which enables transmission of NFLUS oscillations between the resonators.

Due to the type of this connection, a process-related shift in the position of the connected resonators relative to each other destroys the force-transmitting or positively-connected elements of the resonators.

SUMMARY OF THE INVENTION

It is an object of the invention to provide a device which enables a force-transmitting connection between two or more resonators, while at the same time allowing a non-destructive shift in the relative position of the connected resonators.

According to one aspect of the invention there is provided a device for coupling low-frequency high-power ultrasound resonators by way of tolerance-compensating force transmission with at least one contact face between at least two resonators at or in the vicinity of the oscillation maximum of the oscillation to be transmitted by the coupling for the purpose of transmitting low-frequency ultrasound power between the resonators coupled in this manner, wherein the relative position of the resonators can be non-destructively changed.

Preferably, the pressing force required for the force-transmitting connection between the resonators is generated pneumatically. In alternative, the pressing force required for the force-transmitting connection between the resonators is generated by enclosing the connecting elements airtight and pressing the connecting elements together by lowering the interior pressure and/or by increasing the outside pressure, thereby transmitting a pressing force to the contact face of the resonators. According to another alternative, the pressing force required for force-transmitting connection between the resonators is generated hydraulically. The pressing force required for force-transmitting connection between the resonators may be further generated magnetically, especially with one or more permanent magnets or one or more electromagnets. Finally, the pressing force required for force-transmitting connection between the resonators may be generated with one or more elastic elements.

The contact faces of the resonator elements to be connected are preferably configured for this application to provide a form fit, for example plane, concave, convex, conical, round, line-shaped or point-shaped. The pressing force can thus be generated by way of magnetic interactions, elastic elements, hydraulic or pneumatic mechanisms. The components required for producing the pressing force, such as magnets, coil springs or pneumatic seals, can be applied, for example, directly on the resonators or preferably on oscillation-decoupled or oscillation-decoupling connecting elements. The components necessary for generating the pressing force are then substantially or completely free from oscillations.

Permanent magnets, such as rare earth magnets or electromagnets, can be employed for producing a pressing force on the contact face of the resonators by magnetic interaction. These can be attached, for example rotationally symmetric, at the contact face of one or several resonators or preferably at the contact face of one or several connecting elements.

To produce a pressing force by hydraulic or pneumatic mechanisms, a space can be enclosed airtight by the connecting elements. The connecting elements are pressed together by reducing the interior pressure and/or by increasing the outside pressure, thereby transmitting a pressing force to the contact face of the resonators. To produce a pressing force using elastic elements, the resonators or the connecting elements can preferably be pressed against each other with one or several resilient elements, e.g. coil springs or plastic elastomers.

The pressing force in the rest position, i.e., in the absence of ultrasound oscillations, can be between 0.1 and 100 N/mm$^2$, preferably between 1 and 50 N/mm$^2$, most preferred between 5 and 100 N/mm$^2$, e.g. 10 N/mm$^2$. 35.

By using magnetic interactions, elastic elements, hydraulic or pneumatic mechanisms according to the invention, a pressing force oriented toward the contact face is applied to the resonator elements to be connected, which allows a non-destructive shift in the relative position of the resonators connected in this manner.

By optionally employing elastic O-rings, for example made of NBR, at the connection between resonator and connecting element, the oscillations transmitted from the resonator to the connecting element can be reduced, so that only very few or no oscillations at all are transmitted to the connecting element.

The resonators may be rotationally symmetric or one or more resonators may be not rotationally symmetric.

The contact face is preferably located at the oscillation maximum of the longitudinal oscillation A1 of the oscillation to be transmitted or in the vicinity of the oscillation maximum of the longitudinal oscillation A1 of the oscillation to be transmitted.

Resonators and connecting elements may be made of different materials. At least one resonator may be made of one of a steel alloy, an aluminum alloy, a titanium alloy, ceramic and glass. At least one connecting element may be made of a steel alloy, an aluminum alloy, a titanium alloy, ceramic and plastic.

At least one connecting element may be pressed onto a resonator. At least one connecting element may be enlarged before being applied on the resonator by heating, so that after the positioning, pressure is generated between the connecting element and resonator caused by contraction caused by cooling.

At least one resonator may be designed for the transmission of ultrasound with a frequency between 15 and 100 kHz, preferably a frequency between 20 and 30 kHz.

Preferably, ultrasound is transmitted with a power between 1 and 20,000 W, more preferred between 5 and 5,000 W, and most preferred between 10 and 500 W, especially between 10 and 100 W.

Preferably, the contact face between the resonators has a size between 0.01 and 100 $cm^2$, more preferred between 0.1 and 30 $cm^2$, especially between 0.5 and 10 $cm^2$.

At least one of the resonators may have different cross sections along its longitudinal axis. The resonators may also have mutually different cross sections at the contact face.

At least one connecting element may be applied on a resonator in an oscillation-decoupled manner. At least one connecting element may have an oscillation-decoupling geometry. The mutual position of the resonators along the longitudinal axis can preferably be non-destructively changed. The mutual position of the resonators along axes which are different from the longitudinal axis can preferably be non-destructively changed. The mutual position of the resonators may be non-destructively changed in several directions. The mutual position of the resonators may be non-destructively changed through rotation about the longitudinal axes of the oscillation to be transmitted.

The resonance frequency of the resonators may be different from one another by less than 10%, more preferred less than 5%, and most preferred less than 2%, especially less than 1%.

BRIEF DESCRIPTION OF THE DRAWINGS

The invention will now be described in more detail with reference to several exemplary embodiments. The appended drawings show in.

DETAILED DESCRIPTION OF THE INVENTION

All embodiments have in common that a high pressing force between the resonators is produced, making possible a non-destructive shift in the relative position between the resonators in one or several directions.

Figure 1:
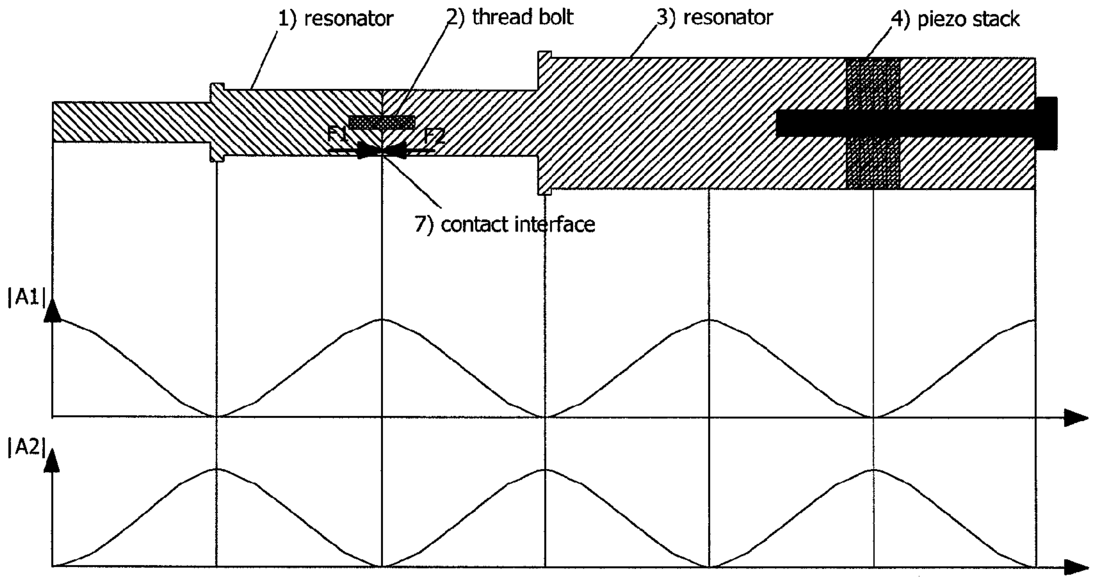
FIG. 1 a device according to the state-of-the-art, wherein two resonators are connected with one another by way of a threaded bolt providing a positive fit and force transmission, FIG. 2 a device according to the invention.
Figure 2:
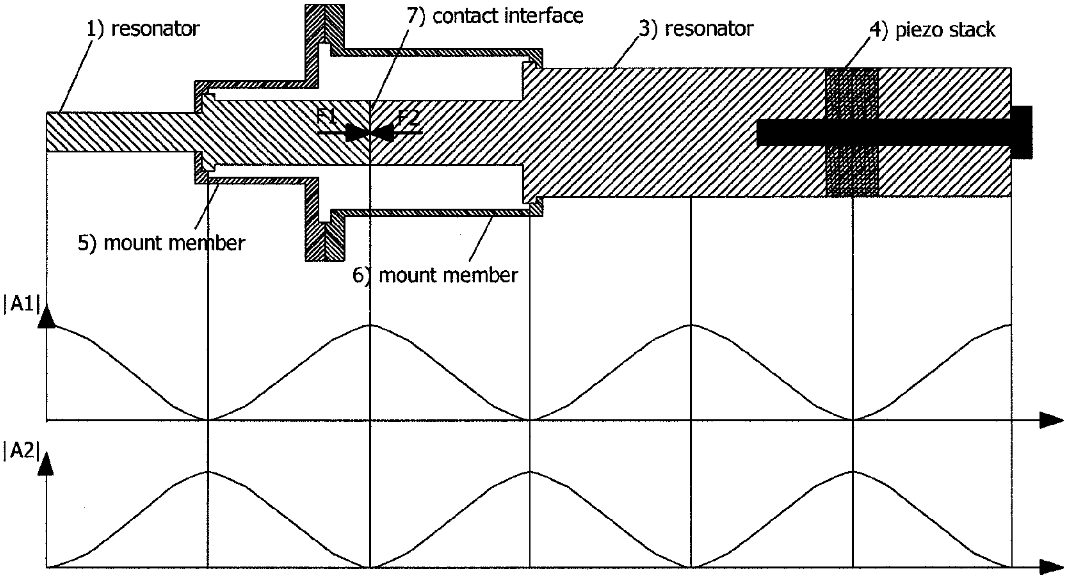
Figure 3:
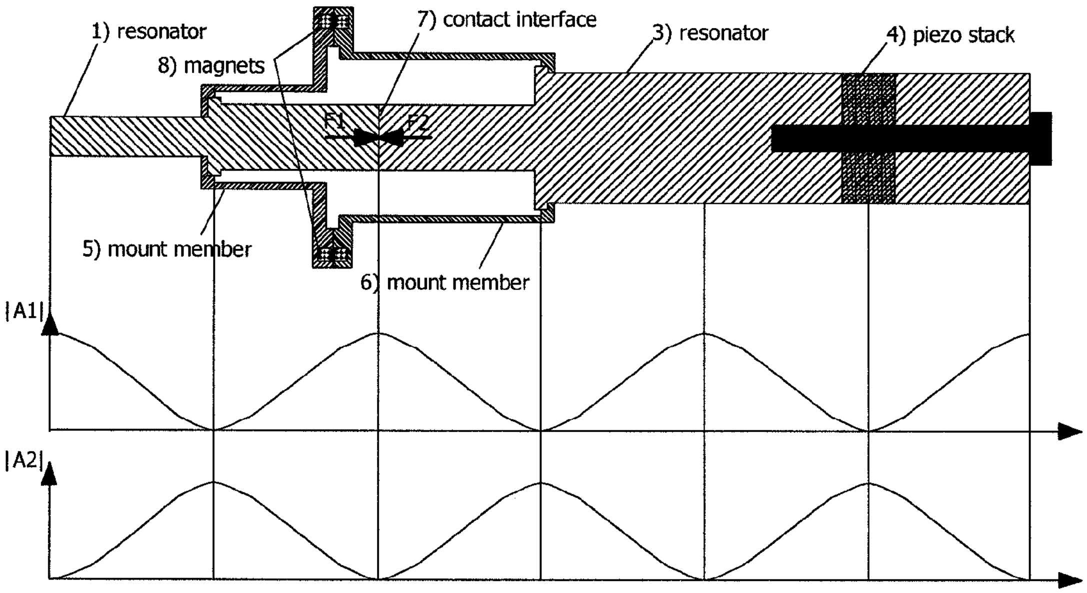
FIG. 3 a similar embodiment as in FIG. 2; however, the pressing force is produced here by magnets attached to the connecting elements.

FIG. 2 illustrates a device according to the invention, wherein a corresponding connecting element is attached on each of the two resonators to be connected. The two resonators are pressed against each other with the forces F1 and F2 by reducing the pressure in the airtight space enclosed by the connecting elements FIG. 3 shows two rotationally symmetric resonators (1, 3) which are made, for example, of titanium grade 5. The resonator has a piezo-ceramic stack (4) producing the ultrasound oscillations. The contact face (7) between the resonators is circular. Permanent magnets are attached to the connecting elements (5, 6) which press the resonators against each other with the forces F1 and F2. The device is operated with low-frequency high-power ultrasound with an operating frequency of 15 to 200 kHz, preferably 15 to 30 kHz, e.g. 30 kHz, and an acoustic power of 1 W to 1,000 W, preferably 10 to 500 W, e.g. 50 W. The oscillation amplitude in the longitudinal direction (A1) at the contact face of the resonators in the longitudinal direction is between 0 and 200 μm, preferably between 10 and 100 μm, e.g. 25 μm.

LIST OF REFERENCE SYMBOLS

1 Lambda/2 resonator
2 threaded bolt
3 2×Lambda/2 resonator
4 piezo-ceramic stack
5 connecting element
6 connecting element
7 contact face between the resonators
8 magnets
F1 force vector
F2 force vector

The invention claimed is:

1. Device for coupling low-frequency high-power ultrasound resonators by way of tolerance-compensating force transmission with at least one contact face between at least two resonators at or in the vicinity of the oscillation maximum of the oscillation to be transmitted by the coupling, for the purpose of transmitting low-frequency ultrasound power between the resonators coupled in this manner, wherein the relative position of the resonators can be non-destructively changed.

2. Device according to claim 1, wherein the pressing force required for the force-transmitting connection between the resonators is generated pneumatically.

3. Device according to claim 1, wherein the pressing force required for the force-transmitting connection between the resonators is generated by enclosing the connecting elements airtight and pressing the connecting elements together by lowering the interior pressure and/or by increasing the outside pressure, thereby transmitting a pressing force to the contact face of the resonators.

4. Device according to claim 1, wherein the pressing force required for force-transmitting connection between the resonators is generated hydraulically.

5. Device according to claim 1, wherein the pressing force required for force-transmitting connection between the resonators is generated magnetically.

6. Device according to claim 5, wherein the pressing force required for force-transmitting connection between the resonators is generated with one or more permanent magnets or with one or more electromagnets.

7. Device according to claim 1, wherein the pressing force required for force-transmitting connection between the resonators is generated with one or more elastic elements.

8. Device according to claim 1, wherein the contact face is located at the oscillation maximum of the longitudinal oscillation A1 of the oscillation to be transmitted or in the vicinity of the oscillation maximum of the longitudinal oscillation A1 of the oscillation to be transmitted.

9. Device according to claim 1, wherein resonators and connecting elements are made of different materials.

10. Device according to claim 1, wherein at least one resonator is made of one selected of a steel alloy, an aluminum alloy, a titanium alloy, ceramic or glass.

11. Device according to claim 1, wherein at least one connecting element is made of one of a steel alloy, an aluminum alloy, a titanium alloy, ceramic or made of plastic.

12. Device according to claim 1, wherein at least one connecting element is pressed onto a resonator.

13. Device according to claim 1, wherein at least one connecting element is enlarged before being applied on the resonator by heating, so that after the positioning, pressure is generated between the connecting element and resonator caused by contraction caused by cooling.

14. Device according to claim 1, wherein at least one resonator is designed for the transmission of ultrasound with a frequency between 15 and 100 kHz.

15. Device according to claim 1, wherein ultrasound is transmitted with a power between 1 and 20,000 W.

16. Device according to claim 1, wherein the contact face between the resonators has a size between 0.01 and 100 $cm^2$.

17. Device according to claim 1, wherein the pressure between the resonators in the rest state, i.e., in the absence of ultrasound oscillations, is between 0.1 and 100 $N/mm^2$.

18. Device according to claim 1, wherein the resonance frequency of the resonators are different from one another by less than 10%.

* * * * *